United States Patent
Gu et al.

(10) Patent No.: US 9,773,741 B1
(45) Date of Patent: Sep. 26, 2017

(54) BONDABLE DEVICE INCLUDING A HYDROPHILIC LAYER

(71) Applicant: QUALCOMM Incorporated, San Diego, CA (US)

(72) Inventors: Shiqun Gu, San Diego, CA (US); Yang Du, Carlsbad, CA (US); William Xia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/239,588

(22) Filed: Aug. 17, 2016

(51) Int. Cl.
*H01L 23/20* (2006.01)
*H01L 23/48* (2006.01)
*H01L 23/52* (2006.01)
*H01L 23/00* (2006.01)
*H01L 23/528* (2006.01)
*H01L 25/065* (2006.01)
*H01L 25/00* (2006.01)

(52) U.S. Cl.
CPC ........ *H01L 23/564* (2013.01); *H01L 23/5283* (2013.01); *H01L 25/0652* (2013.01); *H01L 25/0657* (2013.01); *H01L 25/50* (2013.01); *H01L 2225/06548* (2013.01)

(58) Field of Classification Search
CPC ........ H01L 25/0657; H01L 2224/0401; H01L 24/02; H01L 2224/8365; H01L 23/562; H01L 2224/45099; H01L 2924/0002; H01L 23/5226; H01L 23/10; H01L 21/67144; H01L 24/83; H01L 24/03; H01L 25/50; H01L 2224/81143
See application file for complete search history.

(56) References Cited

U.S. PATENT DOCUMENTS

| 8,318,586 | B2 | 11/2012 | Libralesso et al. |
| 8,722,513 | B2 | 5/2014 | Lee et al. |
| 2008/0116481 | A1* | 5/2008 | Sharma ............. H01L 21/28079 257/175 |
| 2011/0193211 | A1 | 8/2011 | Chandrasekaran et al. |
| 2011/0233791 | A1* | 9/2011 | Mastrangeli ............ H01L 25/50 257/777 |
| 2014/0264854 | A1* | 9/2014 | Thacker .................. H01L 24/14 257/738 |
| 2015/0179605 | A1 | 6/2015 | Dubey et al. |
| 2016/0056089 | A1 | 2/2016 | Taniguchi et al. |

OTHER PUBLICATIONS

Liu, C.-M. et al., "Low-temperature direct copper-to-copper bonding enabled by creep on (111) surfaces of nanotwinned Cu," Scientific Reports, May 12, 2015, Nature Publishing Group, London, U.K., 11 pages.

* cited by examiner

*Primary Examiner* — Jasmine Clark
(74) *Attorney, Agent, or Firm* — Qualcomm Incorporated-Toler

(57) ABSTRACT

An apparatus includes a first component layer. The component layer includes a first semiconductor device. The apparatus further includes a first hydrophilic layer and a first hydrophobic layer. The first hydrophobic layer is positioned between the first component layer and the first hydrophilic layer. The apparatus further includes a first contact extending through the first hydrophobic layer and the first hydrophilic layer.

30 Claims, 9 Drawing Sheets

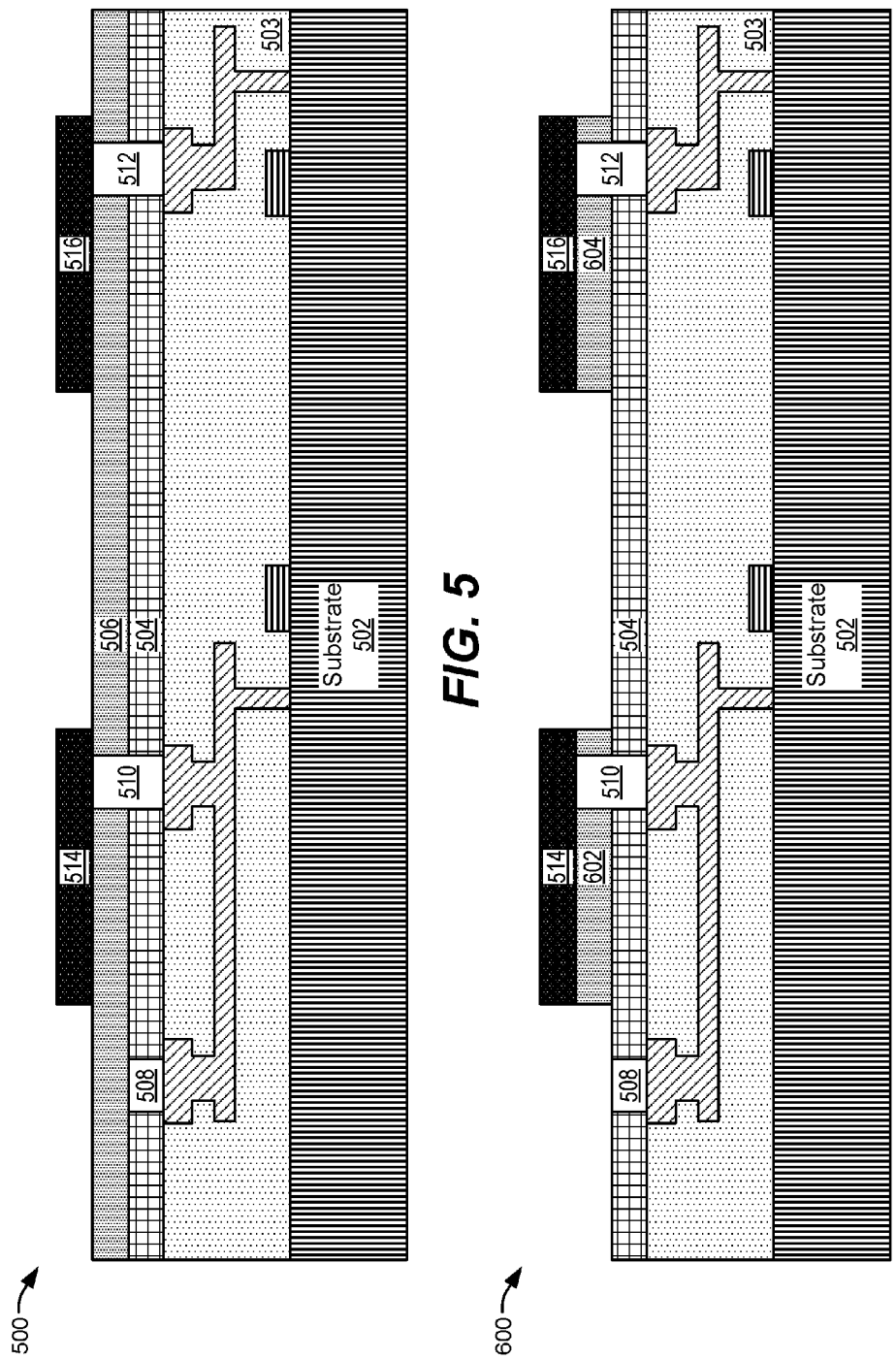

BONDABLE DEVICE INCLUDING A HYDROPHILIC LAYER

I. FIELD

The present disclosure is generally related to a bondable device including a hydrophilic layer.

II. DESCRIPTION OF RELATED ART

Electronic devices with three dimensional stacks of components have a higher circuit density than planar integrated circuit devices. Accordingly, demand for three dimensional stacks of components has increased with demand for smaller and faster electronic devices. However, stacking components may result in decreased manufacturing efficiency due to time needed to align the components.

To increase manufacturing efficiency, some manufacturers utilize self-aligning stacks of components. The components of the self-aligning stacks may be bonded using a polymer. However, conventional techniques used to create self-aligning components may be prone to misalignment of contacts between two components, for example because the components (or portions thereof) may have different sizes. Misalignment of contacts may result in a low yield of usable stacked components for the self-aligning process, decreased operating efficiency of usable stacked components, or both.

III. SUMMARY

An apparatus includes a first component layer that includes a first semiconductor device. The apparatus further includes a first hydrophilic layer and a first hydrophobic layer. The first hydrophobic layer is positioned between the first component layer and the first hydrophilic layer. The apparatus further includes a first contact extending through the first hydrophobic layer and the first hydrophilic layer.

A method of forming a self-aligning device includes forming a first hydrophobic layer on a first component layer. The method further includes forming a first hydrophilic layer on the first hydrophobic layer. The method further includes forming a first contact extending through the first hydrophobic layer and the first hydrophilic layer.

A self-aligned device stack includes a first semiconductor device, a first hydrophobic layer having a first surface area, and a first hydrophilic layer in contact with the first hydrophobic layer. The self-aligned device stack further includes a second hydrophilic layer in contact with the first hydrophilic layer and a second hydrophobic layer in contact with the second hydrophilic layer and having a second surface area that is different from the first surface area. The self-aligned device stack further includes a second semiconductor device.

IV. BRIEF DESCRIPTION OF THE DRAWINGS

Figure 9:
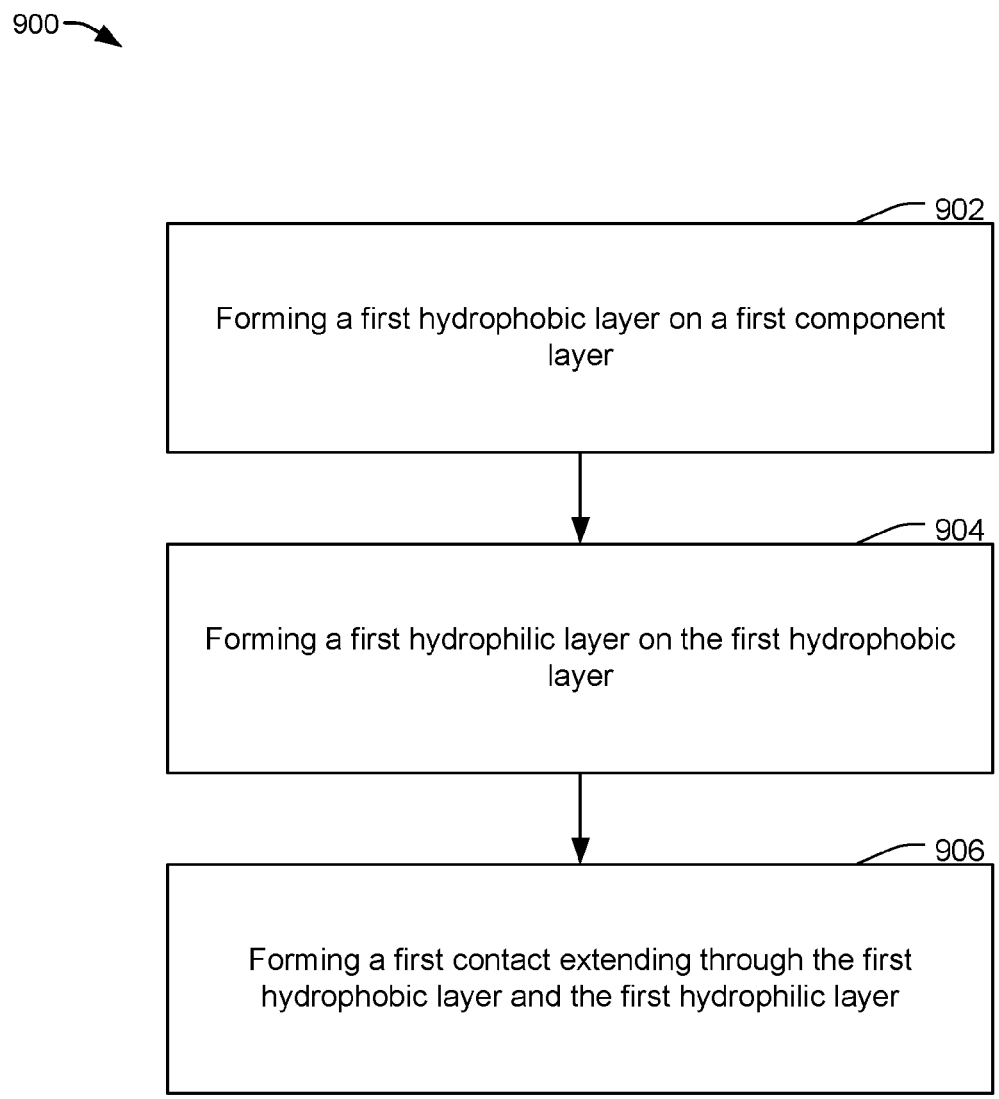
Figure 10:
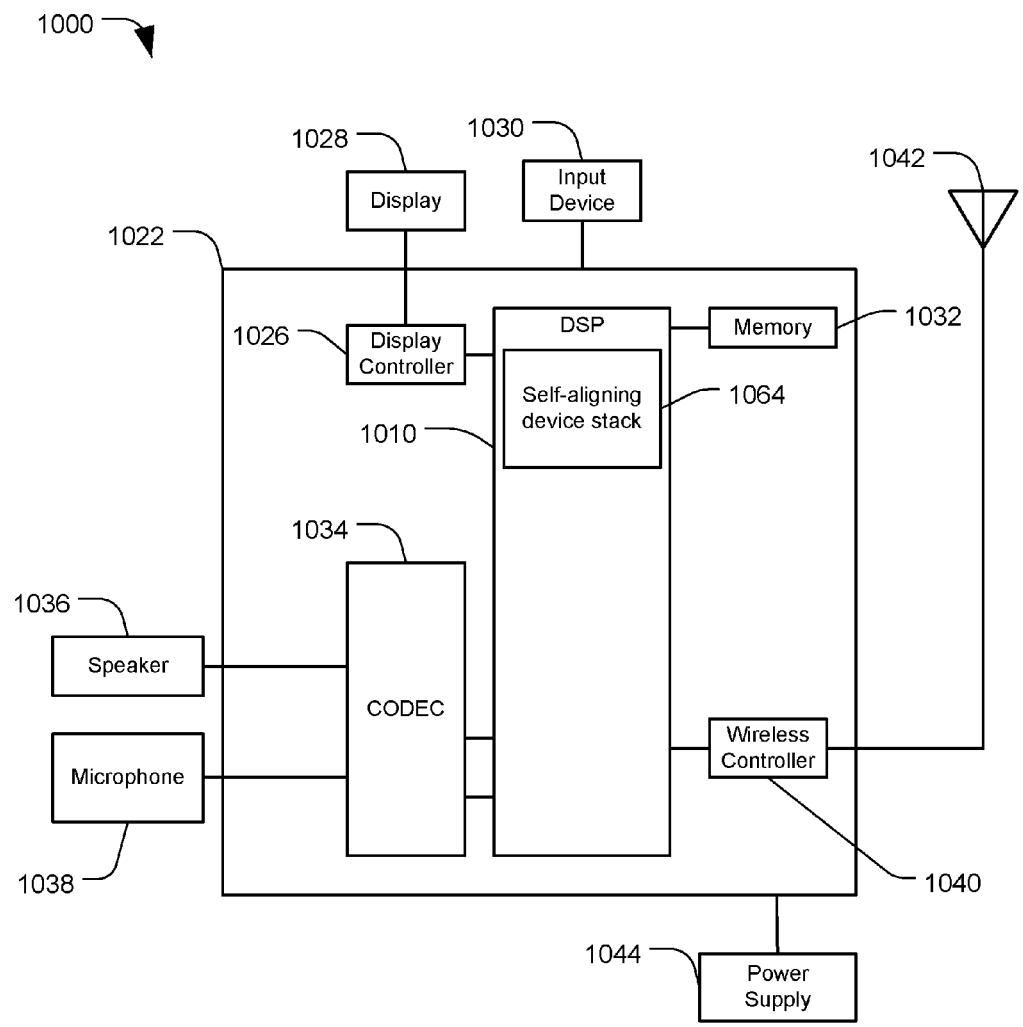
Figure 11:
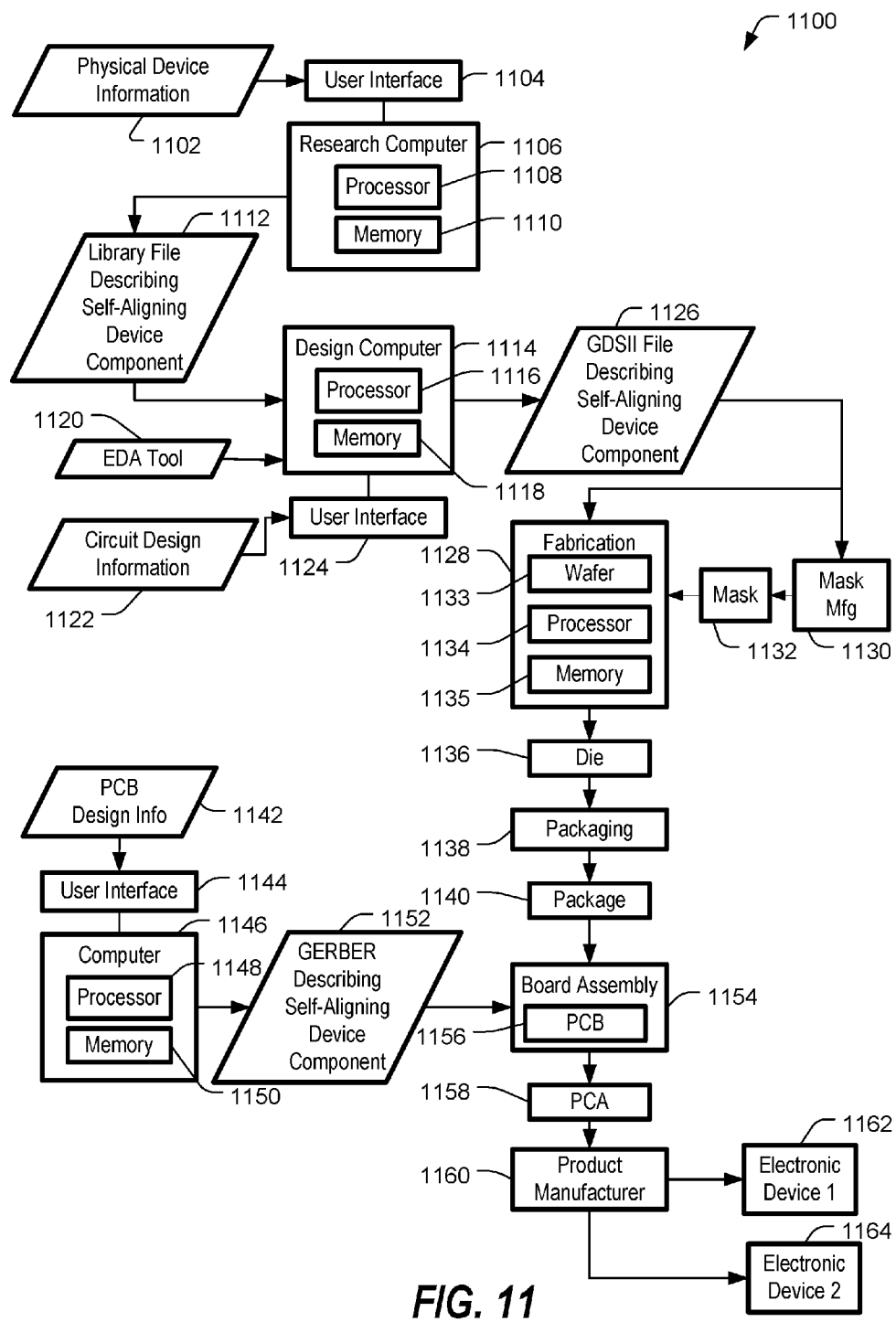

FIGS. 5, 6, 7, and 8 are diagrams illustrating stages of a method of fabricating a self-aligning device;

FIG. 9 is a flowchart illustrating a method of fabricating a self-aligning device;

FIG. 10 is a block diagram illustrating a device that includes a self-aligning device stack; and FIG. 11 a data flow diagram of an illustrative example of a manufacturing process to manufacture electronic devices that include a self-aligning device.

V. DETAILED DESCRIPTION

Particular aspects of the present disclosure are described below with reference to the drawings. In the description, common features are designated by common reference numbers throughout the drawings. As used herein, various terminology is used for the purpose of describing particular implementations and is not intended to be limiting. For example, the singular forms "a," "an," and "the" are intended to include the plural forms as well, unless the context clearly indicates otherwise. It may be further understood that the terms "comprises" and "comprising" may be used interchangeably with "includes" or "including." Additionally, it will be understood that the term "wherein" may be used interchangeably with "where." As used herein, "exemplary" may indicate an example, an implementation, or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

The present disclosure is related to a self-aligning stack of semiconductor devices in which hydrophobic and hydrophilic layers are used to align multiple devices. The stack of multiple devices may include a first device and a second device. Each of the first device and the second device may include a wafer, a die, or other electrical component.

The first device (e.g., a wafer) of the stack may include a first hydrophobic layer positioned between a first component layer (e.g., a layer including at least one semiconductor device, such as a transistor) and a first hydrophilic layer. The first device may include a first contact (e.g., a contact, a pad, a via, or other conductive structure) that extends through the first hydrophilic layer and the first hydrophobic layer. The first contact may be electrically coupled to the at least one semiconductor device of the first component layer. Additionally or alternatively, the second device (e.g., a die) of the stack may include a second hydrophobic layer positioned between a second component layer and a second hydrophilic layer. The second hydrophilic layer may be in contact with the first hydrophilic layer. In some implementations, the size of the hydrophilic layers may be substantially the same. The second device may include a second contact that extends through the first hydrophilic layer and the second hydrophobic layer. The second contact may be electrically coupled to at least one electrical component of the second component layer. The second contact may be bonded to the first contact to electrically couple the first device and the second device. Each of the first contact and the second contact may include nano-twinned Copper (Cu), as an illustrative, non-limiting example. In some implementations, each of the devices may have been fabricated separately prior to being included in the stack of multiple devices.

A self-aligning process may be used to couple the first device (e.g., the wafer) to the second device (e.g., the die) to form the stack of multiple devices. For example, the self-aligning process may use water to self-align the first device and the second device (e.g., to enable the first contact of the first device to be bonded to the second contact of the second device). To illustrate, water may be placed on the first hydrophilic layer of the first device. After the water is placed on the first hydrophilic layer, the second device may be placed above the first device such that the second hydrophilic layer is placed in contact with the water. The second device may move across the water and settle at (e.g., come to rest on) the surface of the water. The position at which the second device settles relative to the first device may be based on a surface area of the first hydrophilic layer, the second hydrophilic layer, or both. To illustrate, by virtue of the hydrophobic and hydrophilic layers having particular sizes, when water is placed between the devices, the devices may naturally move into a position such that contacts of the devices are aligned. In some implementations, the first hydrophilic layer and the second hydrophilic layer may have substantially the same footprint (e.g., a same length, width, surface area, etc.). To assist in alignment of the devices, the first contact may be located at a first location within the first hydrophilic layer at a position that corresponds to a second location of the second contact within the second hydrophilic layer.

After the second device is placed on the water, heat may be applied to cause the water to evaporate. As the water evaporates, the second device descends towards the first device. To illustrate, as the water evaporates, the first hydrophilic layer comes into contact with the second hydrophilic layer. Additionally, evaporation of the water may enable the first contact of the first device to come into contact with the second contact of the second device. That is, the first device and the second device may self-align such that the contacts (from the first device and the second device) come into contact. The contacts may be bonded (e.g., by applying heat to the contacts) to form an electrical connection. In particular implementations, the contacts include nano-twinned Copper. The use of nano-twinned Copper may enable the contacts to bond at lower temperatures as compared to non-nano-twinned Copper.

In some implementations, a device stack may include multiple dies (e.g., a first die and a second die) that are bonded to a single wafer. As used herein, the terms "wafer" and "die" are used to refer to objects that can include one or more semiconductor devices, hydrophobic layers, hydrophilic layers, and contacts. A "wafer" may be larger than a "die," and multiple dies may be bonded to a wafer, as further described herein. For example, a single wafer may include a component layer, a hydrophobic layer and multiple hydrophilic layers, such as a first hydrophilic layer and a second hydrophilic layer. A first portion of the hydrophobic layer may be positioned between the component layer and the first hydrophilic layer and a second portion of the hydrophobic layer may be positioned between the component layer and the second hydrophilic layer. A first contact may extend through the hydrophobic layer and the first hydrophilic layer and a second contact may extend through the hydrophobic layer and the second hydrophilic layer. When a self-aligned device stack including the wafer and the die is formed, a hydrophilic layer of the first die may be in contact with the first hydrophilic layer of the wafer such that the first contact of the wafer is coupled to a contact of the first die. A hydrophilic layer of the second die may be in contact with the second hydrophilic layer such that the second contact of the wafer is coupled to a contact of the second die.

In some examples, the first die and the second die may have different sizes. Nonetheless, the first die and the second die may accurately self-align with the wafer due to the first hydrophilic layer of the wafer having a footprint that is congruent with the footprint of the hydrophilic layer of the first die and the second hydrophilic layer of the wafer having a footprint that is congruent with the footprint of the hydrophilic layer of the second die.

Figure 1:
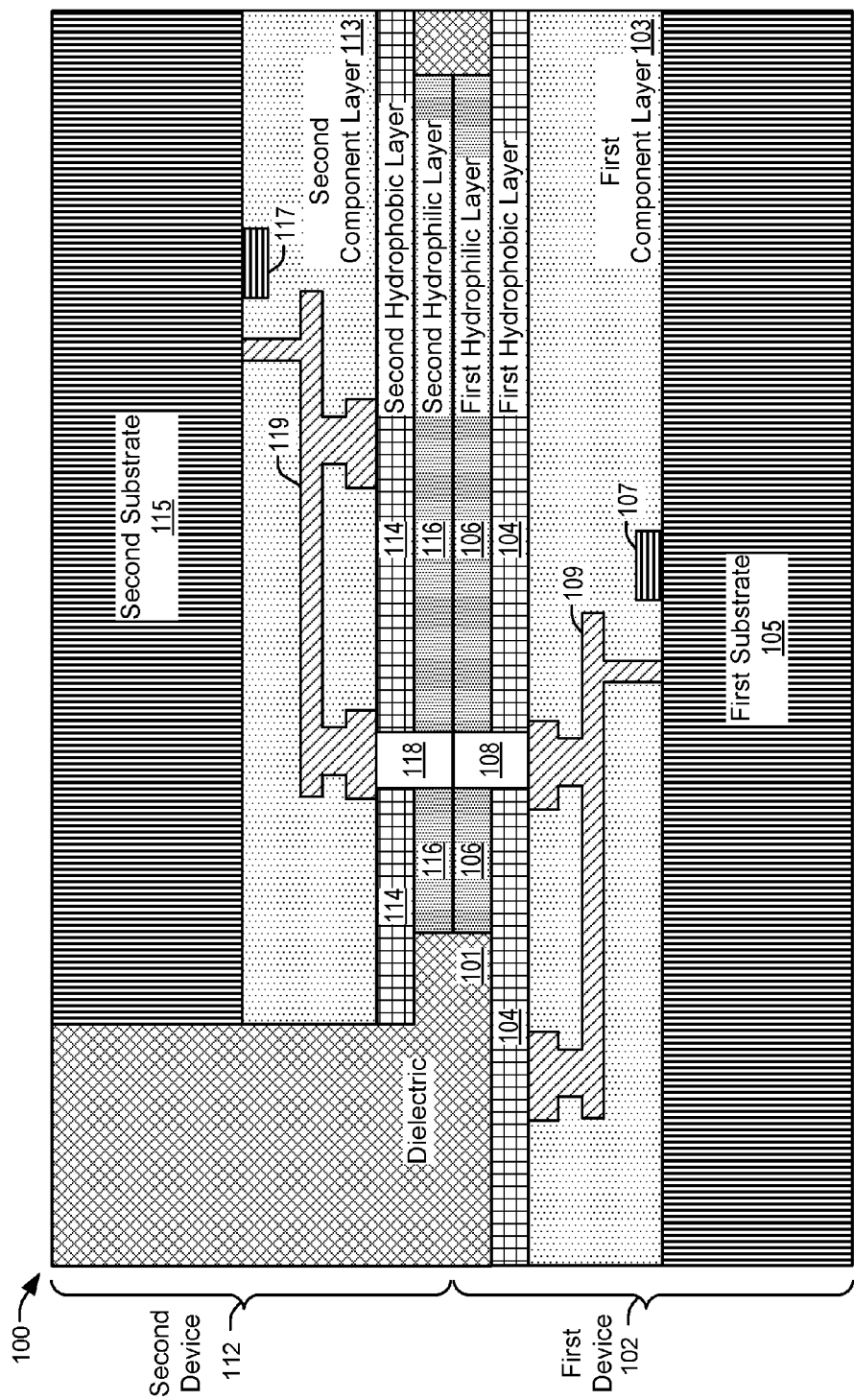
FIG. 1 is a diagram of a self-aligning device stack including a die bonded to a wafer.

Referring to FIG. 1, a diagram of a device stack 100 is shown. The device stack 100 includes a first device 102 (e.g., a wafer) and a second device 112 (e.g., a die) bonded to the first device 102. The device stack 100 may have been formed using a self-aligning process, as described with reference to FIG. 2 and FIG. 9.

The first device 102 includes a first substrate 105 and a first component layer 103. The first component layer 103 is positioned on the first substrate 105. The first component layer 103 includes a first semiconductor device 107 (e.g., a transistor or other semiconductor device) and first circuitry 109. Although FIG. 1 illustrates a component layer including a single semiconductor device, in alternative examples, a component layer may include multiple semiconductor devices.

The first device 102 further includes a first hydrophobic layer 104, a first hydrophilic layer 106, and a first contact 108. The first component layer 103 is positioned between the first hydrophobic layer 104 and the first substrate 105. The first hydrophobic layer 104 may include Aluminum Nitride (AlN), Silicon Carbide (SiC), or a combination thereof, as illustrative, non-limiting examples. The first hydrophilic layer 106 may include Silicon Monoxide (SiO), Silicon Oxycarbide (SiCO), Silicon Oxynitride (SiON), Silicon Nitride (SiN), or a combination thereof, as illustrative non-limiting examples. The first contact 108 includes a conductive material, such as nano-twinned Copper (Cu). The first hydrophobic layer 104 is positioned between the first component layer 103 and the first hydrophilic layer 106. A surface of the first hydrophilic layer 106 is proximate to a surface of the first hydrophobic layer 104. Further, an area of the surface of the first hydrophobic layer 104 is greater than an area of the surface of the first hydrophilic layer 106. The first contact 108 extends through the first hydrophilic layer 106 and the first hydrophobic layer 104. The first contact 108 is electrically coupled to the first circuitry 109.

The second device 112 includes a second substrate 115 and a second component layer 113. The second component layer 113 is positioned on the second substrate 115. The second component layer 113 includes a second semiconductor device 117 (e.g., a transistor or other semiconductor device) and second circuitry 119.

The second device 112 further includes a second hydrophobic layer 114, a second hydrophilic layer 116, and a second contact 118. The second component layer 113 is positioned between the second hydrophobic layer 114 and the second substrate 115. A surface of the second hydrophilic layer 116 is proximate to a surface of the second hydrophobic layer 114. Further, an area of the surface of the second hydrophobic layer 114 is greater than an area of the surface of the second hydrophilic layer 116. The second hydrophobic layer 114 may include AlN, SiC, or a combination thereof, as illustrative non-limiting examples. The second hydrophilic layer 116 may include SiO, SiCO, SiON, SiN, or a combination thereof, as illustrative non-limiting examples. The second contact 118 may include a conductive material, such as nano-twinned Cu. The second hydrophobic layer 114 is positioned between the second component layer 113 and the second hydrophilic layer 116. The second contact 118 extends through the second hydrophilic layer 116 and the second hydrophobic layer 114. The second contact 118 may be electrically coupled to the second circuitry 119.

The second device 112 is stacked on the first device 102 such that the first hydrophilic layer 106 and the second hydrophilic layer 116 are in contact. The devices 102, 112 may be self-aligned, as described in more detail with reference to FIG. 2, such that the contacts 108, 118 are aligned. A footprint of the first hydrophilic layer 106 may be congruent with a footprint of the second hydrophilic layer 116. As used herein, the footprints of hydrophilic layers may be "congruent" when the hydrophilic layers have substantially the same dimensions (e.g., length, width, radius, surface area, etc.). When hydrophilic layers have congruent footprints, application of water may result in the hydrophilic layers naturally settling in positions such that there is little or no part of one hydrophilic layer extending beyond the edge of the other hydrophilic layer. In some examples, the hydrophilic layers 106, 116 may be designed to have congruent footprints via a photolithography process, as further described with reference to FIGS. 5-6.

Further, the first contact 108 may be located at a position within the first hydrophilic layer 106 that matches a position of the second contact 118 within the second hydrophilic layer 116. To illustrate, the first contact 108 and the second contact 118 may each be the same distance away from corresponding edges of the first hydrophilic layer 106 and the second hydrophilic layer 116, respectively. Since alignment of the devices 102, 112 may be based on dimensions of the first hydrophilic layer 106 compared to the second hydrophilic layer 116, the device stack 100 may be more accurately aligned than other device stacks.

The first hydrophilic layer 106 may be bonded to the second hydrophilic layer 116. The first contact 108 may be bonded to the second contact 118, forming an electrical connection between the first semiconductor device 107 and the second semiconductor device 117. In some examples, heat may be applied for bonding. For example, heat may be applied to form bonds between polymer(s) included in the hydrophilic layers 106, 116 and metal(s) included in the contacts 108, 118. In some implementations, the contacts 108, 118 may couple together more than two semiconductor devices. For example, more than one semiconductor device may be included in the first component layer 103 and electrically coupled to the first contact 108.

Although each of the first device 102 and the second device 112 is illustrated as having a single contact, in other implementations, the first device or the second device may include more than one contact that extends through a hydrophilic layer. Bonding contacts of the first device 102 may couple one or more semiconductor devices of the first component layer 103 to one or more semiconductor devices of the second component layer 113.

The device stack 100 further includes dielectric material 101. A portion of the dielectric material 101 is positioned between the first hydrophobic layer 104 and the second hydrophobic layer 114, and a sidewall of the portion of the dielectric material 101 is in contact with the first hydrophilic layer 106 and the second hydrophilic layer 116.

During operation, one or more of the first semiconductor device 107 and the second semiconductor device 117 may be activated. For example, a signal applied to a gate of the first semiconductor device 107 may activate the first semiconductor device 107. The first semiconductor device 107 and the second semiconductor device 117 may exchange signals through the first circuitry 109, the first contact 108, the second contact 118, and the second circuitry 119. The use of hydrophilic layers, hydrophobic layers, and contacts to align the devices 102, 112, as described above, may enable a more accurate alignment of the device stack 100, resulting in improved signaling between the semiconductor devices 107, 117.

Further, since the hydrophilic layers of the self-aligning device stack have substantially the same footprint, contacts located within the hydrophilic layers may be more accurately aligned. In addition, positioning of the hydrophilic layers and dielectric material between the hydrophobic layers may reduce a likelihood of the hydrophobic layers interfering with a bond between the stacked devices. Therefore, the self-aligning device stack illustrated in FIG. 1 may have accurate alignment, strong bonds, and involve low heat to manufacture.

Figure 2:
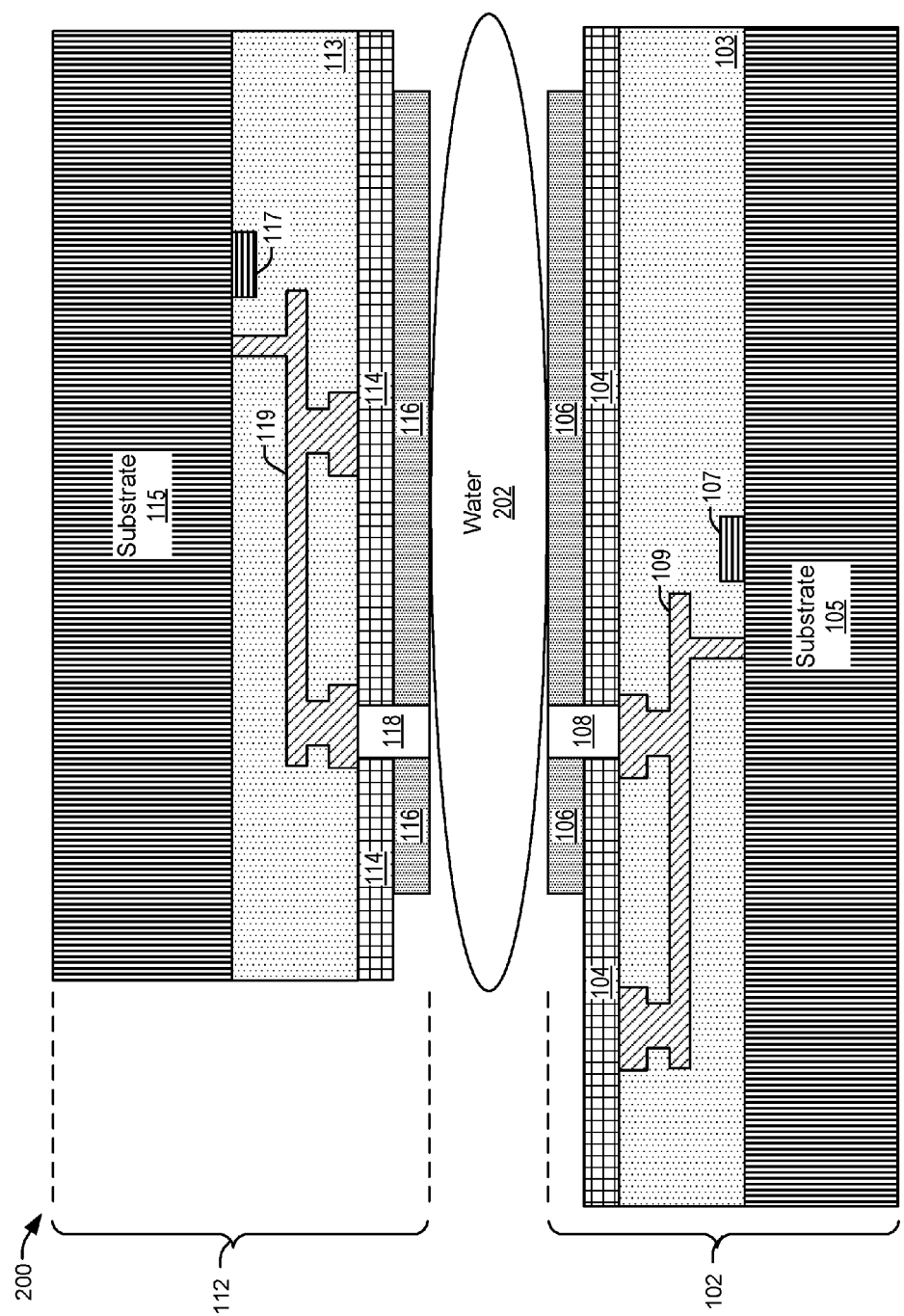
FIG. 2 is a diagram illustrating assembly of the self-aligning device stack of FIG. 1.

Referring to FIG. 2, a diagram illustrating assembling the device stack 100 from the first device 102 and the second device 112 is shown and designated 200. As illustrated in the diagram 200, water 202 is applied to the first hydrophilic layer 106 of the first device 102. For example, an automated fabrication machine (e.g., responsive to instructions executed by a processor) may submerge the first device 102 in water, may drip the water 202 onto the first hydrophilic layer 106 as a single drop, may emit a mist of water causing the water 202 to form on the first hydrophilic layer 106, etc. Once the water 202 is applied to the first hydrophilic layer 106, the automated fabrication machine may place the second device 112 over the first device 102 so that the second hydrophilic layer 116 contacts the water 202.

The second device 112 may move across the water 202 and settle on (e.g., come to rest on) the surface of the water 202. The position at which the second device 112 settles relative to the first device 102 may be based on dimensions of the hydrophilic layers 106, 116. For example, the hydrophilic layers 106, 116 may have substantially the same footprint (e.g., a same length, width, surface area, etc.). Further, the first contact 108 may be located at a first location within the first hydrophilic layer 106 that matches a second location of the second contact 118 within the second hydrophilic layer 116. Accordingly, the second contact 118 may be substantially aligned with the first contact 108 when the second device 112 settles on the surface of the water 202.

The automated fabrication machine may apply heat to evaporate the water 202 causing the second device 112 to descend toward the first device 102. To illustrate, the water 202 may evaporate and the hydrophilic layers 106, 116 and the aligned contacts 108, 118 may come into contact. Once the water has evaporated, the automated fabrication machine may apply heat to the devices 102, 112 to bond the contacts 108, 118 and the hydrophilic layers 106, 116. Since the contacts 108, 118 may include nano-twinned Cu, the automated fabrication machine may apply less heat to bond the contacts 108, 118 as compared to devices utilizing non-nano-twinned Cu. Further, placement of the hydrophilic layers 106, 116 in-between the hydrophobic layers 104, 114 may prevent polymers of the hydrophobic layers 104, 114 from interfering with a bond between the devices 102, 112 (e.g., between the contacts 108, 118, the hydrophilic layers 106, 116, or a combination thereof).

Once the first device 102 is bonded to the second device 112, the automated fabrication machine may form the dielectric material 101 (e.g., using a physical vapor deposition process). Thus, FIG. 2 illustrates assembling of a self-aligning device.

Figure 3:
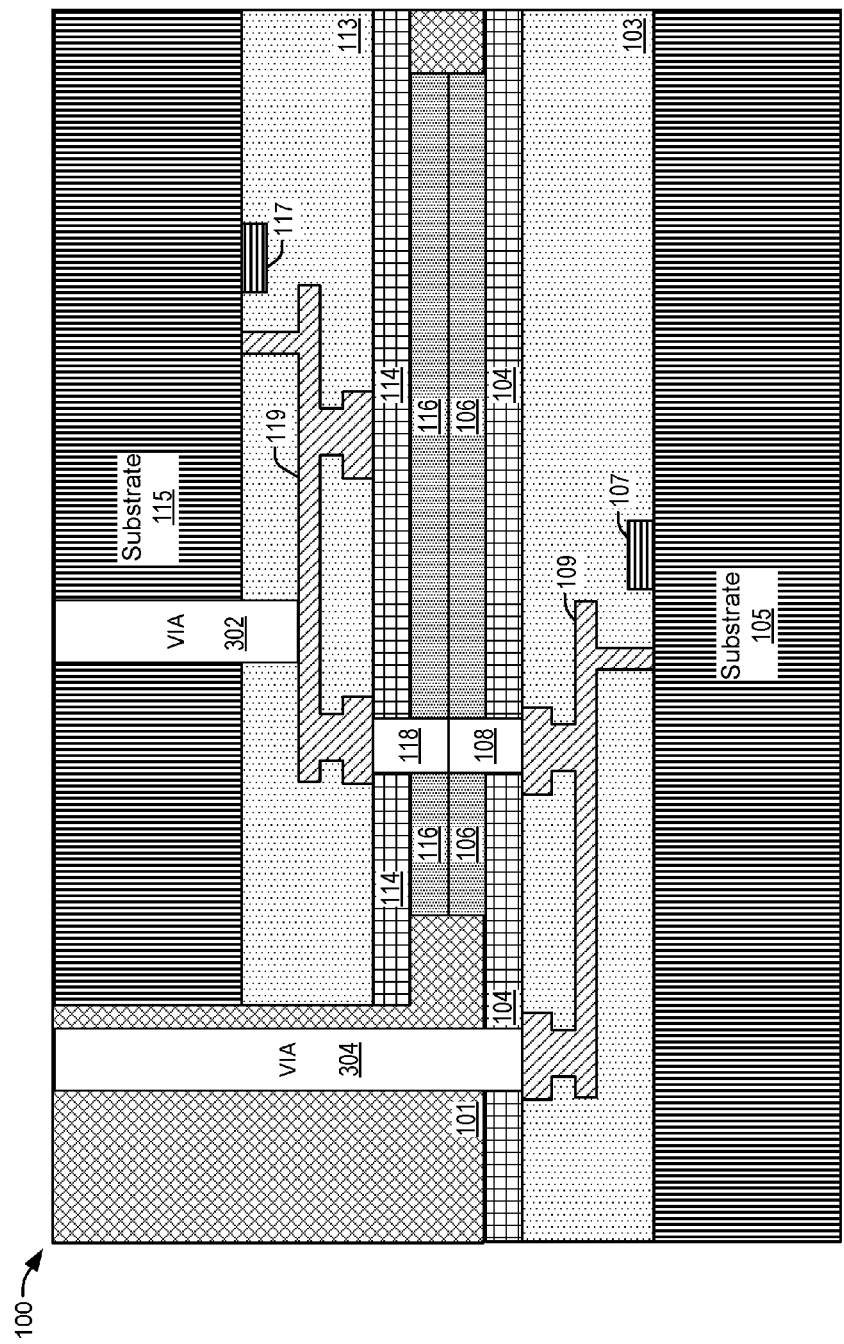
FIG. 3 is a diagram of another example of a self-aligning device stack including a die bonded to a wafer.

Referring to FIG. 3, another example of the self-aligning device stack 100 is illustrated. A self-aligning die stack may include one or more vias coupled to various circuitry of the self-aligning die stack. In the illustrated example of FIG. 3, the self-aligning device stack 100 includes a first via 302 and a second via 304. The first via 302 is positioned through the second substrate 115 of the second device and is coupled to the second circuitry 119. Accordingly, the first via 302 may form an electrical connection to the second semiconductor device 117 (e.g., through the second circuitry 119) and to the first semiconductor device 107 (e.g., through the second circuitry 119, the second contact 118, the first contact 108, and the first circuitry 109).

The second via 304 extends through the dielectric material 101 and the first hydrophobic layer 104 and is coupled to the first circuitry 109. Accordingly, the second via 304 may form an electrical connection to the first semiconductor device 107 (e.g., through the first circuitry 109) and to the second semiconductor device 117 (e.g., through the first circuitry 109, the first contact 108, the second contact 118, and the second circuitry 119). While FIG. 3 illustrates two vias, in other examples, a self-aligning device may include more or fewer vias. Thus, FIG. 3 illustrates that a via may be coupled to any device in a self-aligned device through various layers.

Figure 4:
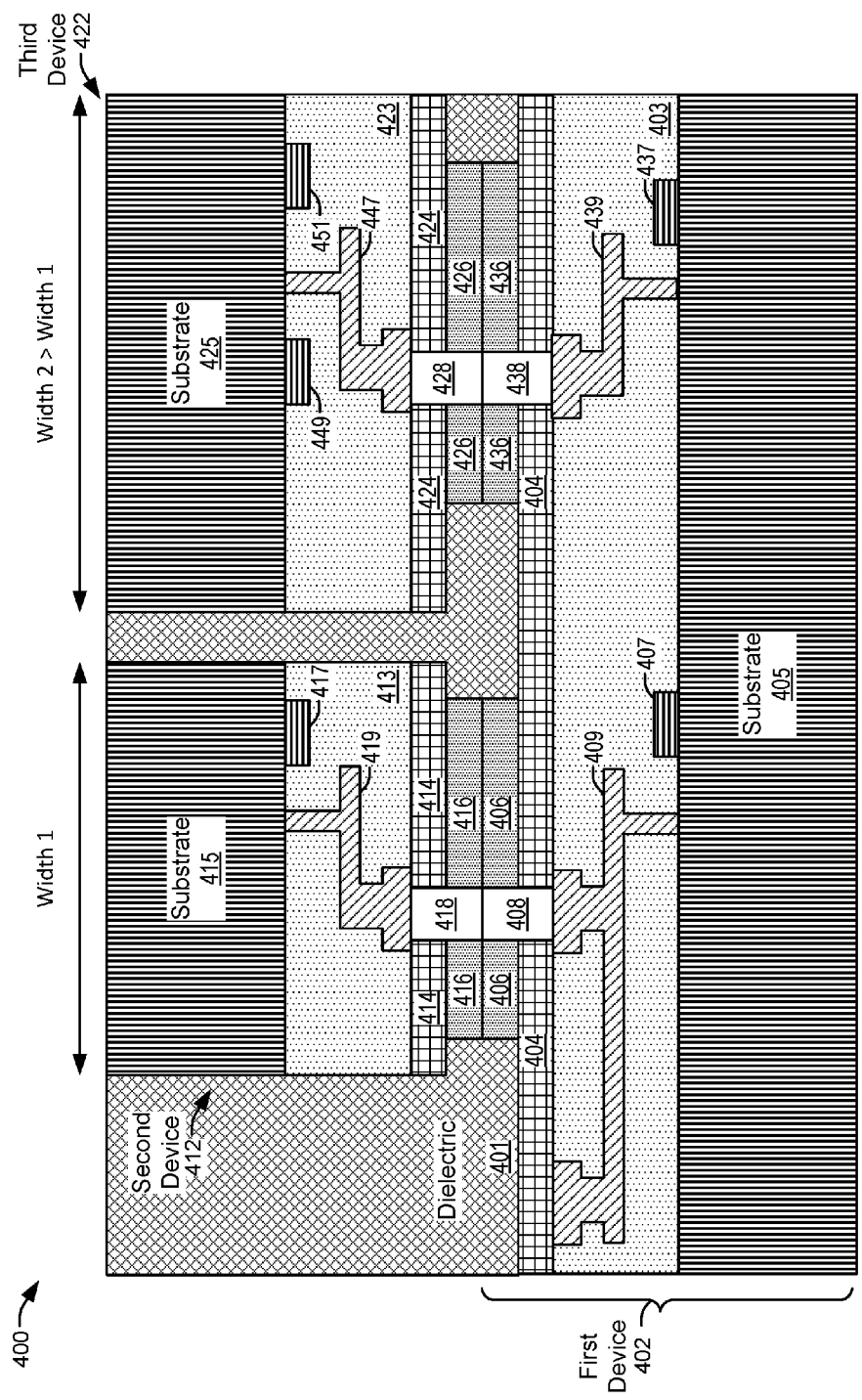
FIG. 4 is a diagram of a self-aligning device stack including two dies bonded to a wafer.

Referring to FIG. 4, a diagram illustrating a self-aligning device stack 400. The self-aligning device stack 400 includes a first device 402 (e.g., a wafer), a second device 412 (e.g., a first die), and a third device 422 (e.g., a second die). The first device 402 includes substrate 405, a first component layer 403, a first hydrophobic layer 404, a first hydrophilic layer 406, and a second hydrophilic layer 436. The first component layer 403 is positioned between the first substrate 405 and the first hydrophobic layer 404. The first hydrophobic layer 404 is positioned between the first component layer 403 and the first hydrophilic layer 406. Further, the first hydrophobic layer 404 is positioned between the first component layer 403 and the second hydrophilic layer 436.

The first hydrophobic layer 404 may include AlN, SiC, or a combination thereof, as illustrative, non-limiting examples. The first hydrophilic layer 406 and the second hydrophilic layer 436 may include SiO, SiCO, SiON, SiN, or a combination thereof, as illustrative non-limiting examples.

The first component layer 403 may include a first semiconductor device 407 (e.g., a transistor) and a second semiconductor device 437 (e.g., a transistor). The first semiconductor device 407 may be coupled to first circuitry 409, and the second semiconductor device 437 may be coupled to second circuitry 439. The first device 402 further includes a first contact 408 that extends through the first hydrophilic layer 406 and the first hydrophobic layer 404 and is coupled to the first circuitry 409. Thus, the first contact 408 may provide an electrical connection to the first semiconductor device 407. The first device 402 further includes a second contact 438 that extends through the second hydrophilic layer 436 and the first hydrophobic layer 404 and is coupled to the second circuitry 439. Thus, the second contact 438 may provide an electrical connection to the second semiconductor device 437. The first contact 408 and the second contact 438 may include, for example, nano-twinned Cu.

The second device 412 includes a second substrate 415, a second component layer 413, a second hydrophobic layer 414, and a third hydrophilic layer 416. The second hydrophobic layer 414 may include AlN, SiC, or a combination thereof, as illustrative, non-limiting examples. The third hydrophilic layer 416 may include SiO, SiCO, SiON, SiN, or a combination thereof, as illustrative non-limiting examples.

The second component layer 413 includes a third semiconductor device 417 (e.g., a transistor). The third semiconductor device 417 may be coupled to third circuitry 419. The second device 412 further includes a third contact 418 that extends through the third hydrophilic layer 416 and the second hydrophobic layer 414 and is coupled to the third circuitry 419. Thus, the third contact 418 may provide an electrical connection to the third semiconductor device 417. The third contact 418 may include, for example, nano-twinned Cu.

The third device 422 includes a third substrate 425, a third component layer 423, a third hydrophobic layer 424, and a fourth hydrophilic layer 426. The third hydrophobic layer 424 may include AlN, SiC, or a combination thereof, as illustrative, non-limiting examples. The fourth hydrophilic layer 426 may include SiO, SiCO, SiON, SiN, or a combination thereof, as illustrative non-limiting examples.

The third component layer 423 includes a fourth semiconductor device 449 (e.g., a transistor) and a fifth semiconductor device 451. The fourth semiconductor device 449 and the fifth semiconductor device 451 may be coupled to fourth circuitry 447. The third device 422 further includes a fourth contact 428 that extends through the fourth hydrophilic layer 426 and the third hydrophobic layer 424 and is coupled to the fourth circuitry 447. Thus, the fourth contact 428 may provide an electrical connection to the fourth semiconductor device 449 and the fifth semiconductor device 451. The fourth contact 428 may include, for example, nano-twinned Cu.

The second device 412 and the third device 422 are stacked on the first device 402 such that the first hydrophilic layer 406 and the third hydrophilic layer 416 are in contact and the second hydrophilic layer 436 and the fourth hydrophilic layer 426 are in contact. The devices 402, 412, and 422 may be self-aligned, as described above, such that the first contact 408 is aligned with the third contact 418 and the second contact 438 is aligned with the fourth contact 428. A footprint of the first hydrophilic layer 406 may be congruent with a footprint of the third hydrophilic layer 416, and a footprint of the second hydrophilic layer 436 may be congruent with a footprint of the fourth hydrophilic layer 426. In particular examples, the footprints of the hydrophilic layers 406, 436, 416, and 426 may all be congruent with each other. As explained above, accuracy of the self-alignment may be based on dimensions of the hydrophilic layers relative to each other. Since each hydrophilic layers of the hydrophilic layers 406, 416, 436, and 426 is in contact with a congruent hydrophilic layer the second device 412 may be accurately aligned with the first device 402, and the third device 422 may be accurately aligned with the first device 402 even though the second device 412 and the third device 422 have differing widths.

The first hydrophilic layer 406 may be bonded to the third hydrophilic layer 416. The first contact 408 may be bonded to the third contact 418 forming an electrical connection between the first semiconductor device 407 and the third semiconductor device 417. The second hydrophilic layer 436 may be bonded to the fourth hydrophilic layer 426. The second contact 438 may be bonded to the fourth contact 428 forming an electrical connection between the second semiconductor device 437 and the fourth semiconductor device 449 and the fifth semiconductor device 451.

The device stack 400 further includes dielectric material 401. A first portion of the dielectric material 401 is positioned between the first hydrophobic layer 404 and the second hydrophobic layer 414 and next to the first hydrophilic layer 406 and the third hydrophilic layer 416. Similarly, a second portion of the dielectric material 401 is positioned between the first hydrophobic layer 404 and the third hydrophobic layer 424 and next to the second hydrophilic layer 436 and the fourth hydrophilic layer 426.

During operation, the first semiconductor device 407 may exchange one or more signals with the third semiconductor device 417 via the first circuitry 409, the first contact 408, the third contact 418, and the third circuitry 419. Similarly, the second semiconductor device 437 may exchange one or more signals with the fourth semiconductor device 449 and the fifth semiconductor device 451 via the second circuitry 439, the second contact 438, the fourth contact 428, and the fourth circuitry 447.

Thus, FIG. 4 illustrates a self-aligning device stack. Since the hydrophilic layers of the self-aligning device stack have substantially the same footprint, contacts located within the hydrophilic layers may be more accurately aligned even if the devices have different dimensions.

Referring to FIG. 5-8 illustrate examples of stages of a fabrication process that may be used to fabricate self-aligning wafers, such as the first device 102 and the first device 402. FIG. 9 illustrates an additional stage of the fabrication process that may be used to fabricate self-aligning dies, such as the second device 112, the second device 412, and the third device 422. The stages of the fabrication process are shown as cross-sectional views of formation of the self-aligning device.

Referring to FIG. 5, a first stage of the fabrication process is depicted and generally designated 500. FIG. 5 illustrates a substrate 502. A component layer 503 is formed over the substrate 502. FIG. 5 further illustrates a hydrophobic layer 504 may be formed (e.g., via a physical vapor deposition process) over the component layer 503. The hydrophobic layer 504 may include AlN, SiC, or a combination thereof, as illustrative non-limiting examples. FIG. 5 further illustrates a hydrophilic material 506 formed (e.g., via a physical vapor deposition process) over the hydrophobic layer 504. The hydrophilic material 506 may include SiO, SiCO, SiON, SiN, or a combination thereof, as illustrative non-limiting examples.

FIG. 5 further illustrates a first contact 510 formed (e.g., via an etch process to form a gap in the hydrophilic material 506 and the hydrophobic layer 504 and a physical vapor deposition process to fill the gap) through the hydrophilic material 506 and the hydrophobic layer 504. The first contact 510 may be coupled to circuitry of the component layer 503. FIG. 5 further illustrates a second contact 512 formed (e.g., via an etch process to form a gap in the hydrophilic material 506 and the hydrophobic layer 504 and a physical vapor deposition process to fill the gap) through the hydrophilic material 506 and the hydrophobic layer 504. The second contact 512 may be coupled to circuitry of the component layer 503. FIG. 5 further illustrates a third contact 508. The third contact 508 may formed (e.g., via an etch process to form a gap in the hydrophobic layer 504 and a physical vapor deposition process to fill the gap) through the hydrophobic layer 504. The third contact 508 may be coupled to circuitry of the component layer 503.

FIG. 5 further illustrates a first photo resist material 514 formed (e.g., via a physical vapor deposition process) on a first portion of the hydrophilic material 506. FIG. 5 further illustrates a second photo resist material 516 formed over a second portion of the hydrophilic material 506. The first photo resist material 514 and the second photo resist material 516 may have substantially the same dimensions. Accordingly, the first portion of the hydrophilic material 506 and the second portion of the hydrophilic material 506 may have substantially the same dimensions.

Referring to FIG. 6, a second stage of the fabrication process is depicted and generally designated 600. The second stage 600 may occur after the first stage 500. As shown in FIG. 6, a portion of the hydrophilic material 506 not covered by the photo resist materials 514, 516 may be removed (e.g., via a photolithography process) to form a first hydrophilic layer 602 and a second hydrophilic layer 604. The first hydrophilic layer 602 may correspond to the first portion of the hydrophilic material 506, and the second hydrophilic layer 604 may correspond to the second portion of the hydrophilic material 506. Accordingly, the first hydrophilic layer 602 and the second hydrophilic layer 604 may have substantially the same dimensions (e.g., have substantially congruent footprints). Further, the first contact 510 may be located at substantially the same position within the first hydrophilic layer 602 as the second contact 512 is within the second hydrophilic layer 604.

Figures 7, 8:
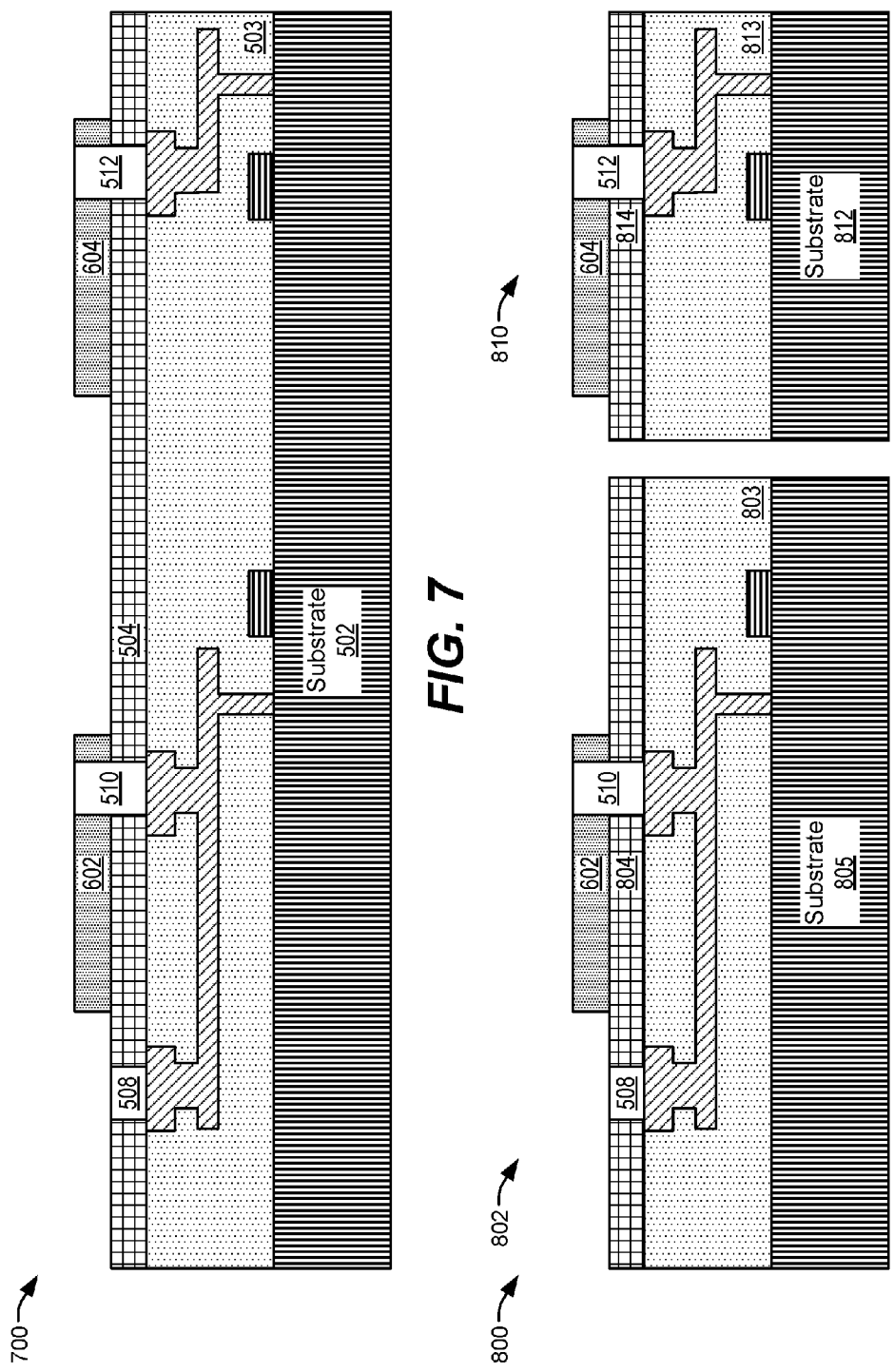

Referring to FIG. 7, a third stage of the fabrication process is depicted and generally designated 700. The third stage 700 may occur after the second stage 600. As shown in FIG. 7, the photoresist materials 514, 516 may be removed (e.g., via an etch process). FIG. 7 illustrates a wafer device that may correspond to the first device 102 or to the first device 402. Thus, FIGS. 5-8 illustrate a process that may be used to form a self-aligning wafer.

Referring to FIG. 8, a fourth stage of the fabrication process is depicted and generally designated 800. The fourth stage 800 may occur after the third stage 700. As shown in FIG. 8, the wafer from the third stage 700 may be divided (e.g., via a dicing process) into dice. For example, FIG. 8 illustrates a first die 802 and a second die 810. The first die 802 includes a first substrate 805, a first component layer 803, a first hydrophobic layer 804, the first hydrophilic layer 602, the first contact 510, and the third contact 508. The second die 810 includes a second substrate 812, a second component layer 813, a second hydrophobic layer 814, the second hydrophilic layer 604, and the second contact 512. The first die 802 and the second die 810 may have different dimensions, and the first hydrophilic layer 602 and the second hydrophilic layer 604 may have substantially congruent footprints.

The first die 802 or the second die 810 may correspond to the second device 112, the second device 412, or the third device 422. Thus, FIGS. 5-8 illustrate a process that may be used to fabricate self-aligning dice.

Referring to FIG. 9, a flowchart illustrating a method 900 of forming a self-aligning device is shown. The method 900 may be performed, for example, by an automated fabrication machine, a system as described with reference to FIG. 11, or by some other apparatus (e.g., a fabrication apparatus). The self-aligning device formed by the method 900 may correspond to the first device 102, the second device 112, the self-aligning device stack 100, the first device 402, the second device 412, the third device 422, the self-aligning device stack 400, the device formed by the process shown in FIGS. 5-7, the device formed by the process shown in FIGS. 5-8, or to another device.

The method 900 includes forming a first hydrophobic layer on a first component layer, at 902. For example, the fabrication apparatus may form the first hydrophobic layer 104 on the first device 102 (e.g., using a physical vapor deposition process).

The method 900 further includes forming a first hydrophilic layer on the first hydrophobic layer, at 904. For example, the fabrication apparatus may form the first hydrophilic layer 106 on the first hydrophobic layer 104.

The method 900 further includes forming a first contact extending through the first hydrophobic layer and the first hydrophilic layer, at 906. For example, the fabrication apparatus may form the first contact 108 extending through the first hydrophobic layer 104 and the first hydrophilic layer 106. To illustrate, the fabrication apparatus may form a gap in the first hydrophilic layer 106 and the first hydrophobic layer 104 by removing portions of the first hydrophilic layer 106 and the first hydrophobic layer 104 (e.g., via an etch process). The fabrication apparatus may form the first contact 108 (e.g., using a physical vapor deposition process) in the gap.

In a particular implementation the method 900 further includes forming a second hydrophobic layer on a second component layer of a die. For example, the fabrication apparatus may form the second hydrophobic layer 114. The method 900 may further include forming a second hydrophilic layer on the second hydrophobic layer. For example, the fabrication apparatus may form the second hydrophilic layer 116 on the second hydrophobic layer 114. The method 900 may further include forming a second contact extending through the second hydrophobic layer and the second hydrophilic layer. For example, the fabrication apparatus may form the second contact 118 extending through the second hydrophilic layer 116 and the second hydrophobic layer 114.

The method 900 may further include applying water to the first hydrophilic layer. For example, the fabrication apparatus may apply the water 202 to the first hydrophilic layer 106. The method 900 may further include stacking the die on the wafer so that the second hydrophilic layer contacts the water. For example, the fabrication apparatus may stack the second device 112 on the first device 102 so that the second hydrophilic layer 116 contacts the water 202.

In a particular implementation, forming the first hydrophilic layer may include depositing a hydrophilic material on the first hydrophobic layer. For example, the fabrication apparatus may deposit (e.g., using a physical vapor deposition process) hydrophilic material (e.g., SiO, SiON, SiCO, SiN, etc.) on the first hydrophobic layer 104. In a particular implementation, the fabrication apparatus may deposit a photo resist material over a first portion of the hydrophilic material. The fabrication apparatus may form the first hydrophilic layer by removing a portion of the hydrophilic material using photolithography. In a particular implementation, the method 900 may include depositing a second photo resist material on a second portion of the hydrophilic material. The fabrication apparatus may form the first hydrophilic layer corresponding to the first portion of the hydrophilic material and may form a second hydrophilic layer corresponding to the second portion of the hydrophilic material by removing (e.g., using photolithography) a portion of the hydrophilic material. For example, the particular implementation of the method 900 may be used to form the first hydrophilic layer 406 and the second hydrophilic layer 436 illustrated in FIG. 4. The first and second hydrophilic layers may have congruent footprints (e.g., the first and second hydrophilic layers may have substantially the same dimensions).

In a particular implementation, the method 900 further includes dividing the wafer into a plurality of dies. Each die includes a hydrophobic layer between a hydrophilic layer and a component layer. The plurality of dies may include at least two dies having varying sizes. For example, FIG. 8 illustrates division of a wafer into a first die 802 and a second die 810 having differing sizes. Each of the dies 802, 810 has a hydrophobic layer between a hydrophilic layer and a component layer.

Thus, the method 900 may be used to form a self-aligning device. The self-aligning device may align more accurately than other self-aligning devices due to positioning of a hydrophobic layer relative to a hydrophilic layer.

Referring to FIG. 10, a block diagram of a particular illustrative implementation of a device (e.g., a mobile device, such as a wireless communication device) is depicted and generally designated 1000. In various implementations, the device 1000 may have more or fewer components than illustrated in FIG. 10.

In a particular implementation, the device 1000 includes a processor 1010, such as a central processing unit (CPU) or a digital signal processor (DSP), coupled to a memory 1032. The processor 1010 may include a self-aligning device stack 1064, such as the self-aligning device stack 100 or the self-aligning device stack 400.

The memory 1032 includes instructions 1068 (e.g., executable instructions) such as computer-readable instructions or processor-readable instructions. The instructions 1068 may include one or more instructions that are executable by a computer, such as the processor 1010.

FIG. 10 also illustrates a display controller 1026 that is coupled to the processor 1010 and to a display 1028. A coder/decoder (CODEC) 1034 may also be coupled to the processor 1010. Speakers 1036 and microphones 1038 may be coupled to the CODEC 1034.

FIG. 10 also illustrates that a wireless controller 1040, such as a wireless interface, and a transceiver 1046 may be coupled to the processor 1010 and to an antenna 1042, such that wireless data received via the antenna 1042, the transceiver 1046, and the wireless controller 1040 may be provided to the processor 1010. In some implementations, the processor 1010, the display controller 1026, the memory 1032, the CODEC 1034, the wireless controller 1040, and the transceiver 1046 are included in a system-in-package or system-on-chip device 1022. In some implementations, an input device 1030 and a power supply 1044 are coupled to the system-on-chip device 1022. Moreover, in a particular implementation, as illustrated in FIG. 10, the display 1028, the input device 1030, the speakers 1036, the microphones 1038, the antenna 1042, and the power supply 1044 are external to the system-on-chip device 1022. In a particular implementation, each of the display 1028, the input device 1030, the speakers 1036, the microphones 1038, the antenna 1042, and the power supply 1044 may be coupled to a component of the system-on-chip device 1022, such as an interface or a controller.

The device 1000 may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 1000 may include a set top box, an entertainment unit, a navigation device, a personal digital assistant (PDA), a monitor, a computer monitor, a television, a radio, a satellite radio, a music player, a digital music player, a portable music player, a video player, a digital video player, a digital video disc (DVD) player, a portable digital video player, a vehicle, a component integrated within a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

While FIG. 10 illustrates the processor 1010 as including the self-aligning device stack 1064, any component of a device, such as the device 1000, may include a self-aligning device stack. For example, the wireless controller 1040, the memory 1032, the input device 1030, the display 1028, the display controller 1026, or any other electronic device may include a self-aligning device stack.

While FIG. 10 illustrates a wireless communication device including a self-aligning device stack, a self-aligning device stack may be included in various other electronic devices. For example, a self-aligning device stack, as described with reference to FIGS. 1-9, may be included in one or more components of a base station.

A base station may be part of a wireless communication system. The wireless communication system may include multiple base stations and multiple wireless devices. The wireless communication system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA.

Various functions may be performed by one or more components of the base station, such as sending and receiving messages and data (e.g., audio data). The one or more components of the base station may include a processor (e.g., a CPU), a transcoder, a memory, a network connection, a media gateway, a demodulator, a transmission data processor, a receiver data processor, a transmission multiple input-multiple output (MIMO) processor, transmitters and receivers (e.g., transceivers), an array of antennas, or a combination thereof. One or more of the components of the base station may include a self-aligning device stack, as described above with reference to FIGS. 1-9.

During operation of a base station, one or more antennas of the base station may receive a data stream from a wireless device. A transceiver may receive the data stream from the one or more antennas and may provide the data stream to the demodulator. The demodulator may demodulate modulated signals of the data stream and provide demodulated data to the receiver data processor. The receiver data processor may extract audio data from the demodulated data and provide the extracted audio data to the processor.

The processor may provide the audio data to the transcoder for transcoding. The decoder of the transcoder may decode the audio data from a first format into decoded audio data and the encoder may encode the decoded audio data into a second format. In some implementations, the encoder may encode the audio data using a higher data rate (e.g., upconvert) or a lower data rate (e.g., downconvert) than received from the wireless device. In other implementations the audio data may not be transcoded. Transcoding operations (e.g., decoding and encoding) may be performed by multiple components of the base station. For example, decoding may be performed by the receiver data processor and encoding may be performed by the transmission data processor. In other implementations, the processor may provide the audio data to the media gateway for conversion to another transmission protocol, coding scheme, or both. The media gateway may provide the converted data to another base station or core network via the network connection.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 11 depicts a particular illustrative aspect of an electronic device manufacturing process 1100.

Physical device information 1102 is received at the manufacturing process 1100, such as at a research computer 1106. The physical device information 1102 may include design information representing at least one physical property of the self-aligning device stack 100, the self-aligning device stack 400, a self-aligning device fabricated according to the method 900 of FIG. 9, or a combination thereof. For example, the physical device information 1102 may include physical parameters, material characteristics, and structure information that is entered via a user interface 1104 coupled to the research computer 1106. For example, the physical device information 1102 may describe a self-aligning device stack including a first device and a second device. Each of the first and second devices may include a hydrophobic layer on a component layer and a hydrophilic layer on the hydrophobic layer. Each of the devices may include a contact that extends through the hydrophobic and hydrophilic layers. To illustrate, the physical device information 1102 may describe the first device 102, the second device 112, the first device 402, the second device 412, the third device 422, or a combination thereof. The research computer 1106 includes a processor 1108, such as one or more processing cores, coupled to a computer-readable medium (e.g., a non-transitory computer-readable medium), such as a memory 1110. The memory 1110 may store computer-readable instructions that are executable to cause the processor 1108 to transform the physical device information 1102 to comply with a file format and to generate a library file 1112.

In some implementations, the library file 1112 includes at least one data file including the transformed design information. For example, the library file 1112 may include a library of devices including a device that includes the self-aligning device stack 100, the self-aligning device stack 400, a self-aligning device fabricated according to the method 900 of FIG. 9, or a combination thereof, that is provided for use with an electronic design automation (EDA) tool 1120. For example, the library file 1112 may include information describing fabrication of the first device 102, the second device 112, the first device 402, the second device 412, the third device 425, or a combination thereof. The library file 1112 may further describe assembly of the self-aligning device stack 100, as illustrated in FIG. 2.

The library file 1112 may be used in conjunction with the EDA tool 1120 at a design computer 1114 including a processor 1116, such as one or more processing cores, coupled to a memory 1118. The EDA tool 1120 may be stored as processor executable instructions at the memory 1118 to enable a user of the design computer 1114 to design a circuit self-aligning device stack 100, the self-aligning device stack 400, a self-aligning device fabricated according to the method 900 of FIG. 9, or a combination thereof. For example, a user of the design computer 1114 may enter circuit design information 1122 via a user interface 1124 coupled to the design computer 1114.

The circuit design information 1122 may include design information representing at least one physical property of a component of the self-aligning device stack 100, the self-aligning device stack 400, a self-aligning device fabricated according to the method 900 of FIG. 9, or a combination thereof. To illustrate, the circuit design property may include identification of particular circuits and relationships to other elements in a circuit design, positioning information, feature size information, interconnection information, or other information representing a physical property of components of the self-aligning device stack 100, the self-aligning device stack 400, a self-aligning device fabricated according to the method 900 of FIG. 9, or a combination thereof.

The design computer 1114 may be configured to transform the design information, including the circuit design information 1122, to comply with a file format. To illustrate, the file format may include a database binary file format representing planar geometric shapes, text labels, and other information about a circuit layout in a hierarchical format, such as a Graphic Data System (GDSII) file format. The design computer 1114 may be configured to generate a data file including the transformed design information, such as a GDSII file 1126 that includes information describing the self-aligning device stack 100, the self-aligning device stack 400, a self-aligning device fabricated according to the method 900 of FIG. 9, or a combination thereof, in addition to other circuits or information. To illustrate, the data file may include information corresponding to a system-on-chip (SOC) that includes the self-aligning device stack 100, the self-aligning device stack 400, a self-aligning device fabricated according to the method 900 of FIG. 9, or a combination thereof, and that also includes additional electronic circuits and components within the SOC.

The GDSII file 1126 may be received at a fabrication process 1128 to manufacture the self-aligning device stack 100, the self-aligning device stack 400, a self-aligning device fabricated according to the method 900 of FIG. 9, or a combination thereof, according to transformed information in the GDSII file 1126. For example, a device manufacture process may include providing the GDSII file 1126 to a mask manufacturer 1130 to create one or more masks, such as masks to be used with photolithography processing, illustrated as a representative mask 1132. The mask 1132 may be used during the fabrication process to generate one or more wafers 1133, which may be tested and separated into dies, such as a representative die 1136. The die 1136 includes a circuit including a device that includes the self-aligning device stack 100, the self-aligning device stack 400, a self-aligning device fabricated according to the method 900 of FIG. 9, or a combination thereof.

For example, the fabrication process 1128 may include a processor 1134 and a memory 1135 to initiate and/or control the fabrication process 1128. The memory 1135 may include executable instructions such as computer-readable instructions or processor-readable instructions. The executable instructions may include one or more instructions that are executable by a computer such as the processor 1134.

The fabrication process 1128 may be implemented by a fabrication system that is fully automated or partially automated. For example, the fabrication process 1128 may be automated according to a schedule. The fabrication system may include fabrication equipment (e.g., processing tools) to perform one or more operations to form the self-aligning device stack 100, the self-aligning device stack 400, a self-aligning device fabricated according to the method 900 of FIG. 9, or a combination thereof. For example, the fabrication equipment may be configured to deposit one or more materials, etch one or more materials, etch one or more dielectric materials, perform a chemical mechanical planarization process, perform a thermal anneal, deposit a conductive material, perform a chemical vapor deposition (CVD) process, etc., or a combination thereof, as illustrative, non-limiting examples.

The fabrication system (e.g., an automated system that performs the fabrication process 1128) may have a distributed architecture (e.g., a hierarchy). For example, the fabrication system may include one or more processors, such as the processor 1134, one or more memories, such as the memory 1135, and/or controllers that are distributed according to the distributed architecture. The distributed architecture may include a high-level processor that controls or initiates operations of one or more low-level systems. For example, a high-level portion of the fabrication process 1128 may include one or more processors, such as the processor 1134, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 1134.

Alternatively, the processor 1134 may be a part of a high-level system, subsystem, or component of the fabrication system. In another implementation, the processor 1134 includes distributed processing at various levels and components of a fabrication system.

Thus, the processor 1134 may include processor-executable instructions that, when executed by the processor 1134, cause the processor 1134 to initiate or control formation of a self-aligning device or a self-aligning device stack, such as the self-aligning device stack 100, the self-aligning device stack 400, a self-aligning device fabricated according to the method 900 of FIG. 9, or a combination thereof. In some implementations, the memory 1135 is a non-transient computer-readable medium storing computer-executable instructions that are executable by the processor 1134 to cause the processor 1134 to initiate formation of a semiconductor device in accordance with at least a portion of the method 900 of FIG. 9. For example, the computer executable instructions may be executable to cause the processor 1134 to initiate or control formation of the self-aligning device stack 100, the self-aligning device stack 400, a self-aligning device fabricated according to the method 900 of FIG. 9, or a combination thereof.

The die 1136 may be provided to a packaging process 1138 where the die 1136 is incorporated into a representative package 1140. For example, the package 1140 may include the single die 1136 or multiple dies, such as a system-in-package (SiP) arrangement. For example, the package 1140 may include or correspond to the system in package or system-on-chip device 1022 of FIG. 10. The package 1140 may be configured to conform to one or more standards or specifications, such as Joint Electron Device Engineering Council (JEDEC) standards.

Information regarding the package 1140 may be distributed to various product designers, such as via a component library stored at a computer 1146. The computer 1146 may include a processor 1148, such as one or more processing cores, coupled to a memory 1150. A printed circuit board (PCB) tool may be stored as processor executable instructions at the memory 1150 to process PCB design information 1142 received from a user of the computer 1146 via a user interface 1144. The PCB design information 1142 may include physical positioning information of a packaged semiconductor device on a circuit board, the packaged semiconductor device including the self-aligning device stack 100, the self-aligning device stack 400, a self-aligning device fabricated according to the method 900 of FIG. 9, or a combination thereof.

The computer 1146 may be configured to transform the PCB design information 1142 to generate a data file, such as a GERBER file 1152 with data that includes physical positioning information of a packaged semiconductor device on a circuit board, as well as layout of electrical connections such as traces (e.g., metal lines) and vias (e.g., via structures), where the packaged semiconductor device corresponds to the package 1140 including the self-aligning device stack 100, the self-aligning device stack 400, a self-aligning device fabricated according to the method 900 of FIG. 9, or a combination thereof. In other implementations, the data file generated by the transformed PCB design information may have a format other than a GERBER format.

The GERBER file 1152 may be received at a board assembly process 1154 and used to create PCBs, such as a representative PCB 1156, manufactured in accordance with the design information stored within the GERBER file 1152. For example, the GERBER file 1152 may be uploaded to one or more machines to perform various steps of a PCB production process. The PCB 1156 may be populated with electronic components including the package 1140 to form a representative printed circuit assembly (PCA) 1158.

The PCA 1158 may be received at a product manufacture process 1160 and integrated into one or more electronic devices, such as a first representative electronic device 1162 and a second representative electronic device 1164. For example, the first representative electronic device 1162, the second representative electronic device 1164, or both, may include the device 1000 of FIG. 10. As an illustrative, non-limiting example, the first representative electronic device 1162, the second representative electronic device 1164, or both, may include a communications device, a fixed location data unit, a mobile location data unit, a mobile phone, a cellular phone, a satellite phone, a computer, a tablet, a portable computer, or a desktop computer, into which self-aligning device stack 100, the self-aligning device stack 400, a self-aligning device fabricated according to the method 900 of FIG. 9, or a combination thereof, is integrated.

Alternatively or additionally, the first representative electronic device 1162, the second representative electronic device 1164, or both, may include a base station, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the self-aligning device stack 100, the self-aligning device stack 400, a self-aligning device fabricated according to the method 900 of FIG. 9, or a combination thereof, is integrated. As another illustrative, non-limiting example, one or more of the electronic devices 1162 and 1164 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 11 illustrates remote units according to teachings of the disclosure, the disclosure is not limited to these illustrated units. Aspects of the disclosure may be suitably employed in any device which includes active integrated circuitry including memory and on-chip circuitry.

A device that includes the self-aligning device stack 100, the self-aligning device stack 400, a self-aligning device fabricated according to the method 900 of FIG. 9, or a combination thereof, may be fabricated, processed, and incorporated into an electronic device, as described in the illustrative process 1100. One or more aspects disclosed with respect to FIGS. 1-11, such as specific device structures or instructions to initiate specific fabrication steps, may be included within the library file 1112, the GDSII file 1126 (e.g., a file having a GDSII format), and the GERBER file 1152 (e.g., a file having a GERBER format), as well as stored at the memory 1110 of the research computer 1106, the memory 1118 of the design computer 1114, the memory 1150 of the computer 1146, the memory of one or more other computers or processors (not shown) used at the various stages, such as at the board assembly process 1154, and also incorporated into one or more other physical aspects such as the mask 1132, the die 1136, the package 1140, the PCA 1158, other products such as prototype circuits or devices (not shown), or any combination thereof. Although various representative stages of production from a physical device design to a final product are depicted, in other implementations fewer stages may be used or additional stages may be included. Similarly, the process 1100 may be performed by a single entity or by one or more entities performing various stages of the process 1100.

Although one or more of FIGS. 1-11 may illustrate systems, apparatuses, or methods according to the teachings of the disclosure, the disclosure is not limited to these illustrated systems, apparatuses, or methods. One or more functions or components of any of FIGS. 1-11 as illustrated or described herein may be combined with one or more other portions of another of FIGS. 1-11. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

In conjunction with the described aspects, an apparatus includes first means for processing electrical signals. For example, the first means for processing electrical signals may correspond to the first component layer 103, the second component layer 113, the first semiconductor device 107, the second semiconductor device 117, the first component layer 403, the second component layer 413, the third component layer 423, the first semiconductor device 407, the second semiconductor device 437, the third semiconductor device 417, the fourth semiconductor device 449, the fifth semiconductor device 451, the component layer 503, the first component layer 803, the second component layer 813, or a combination thereof.

The apparatus further includes first means for attracting water. For example, the first means for attracting water may include the first hydrophilic layer 106, the second hydrophilic layer 116, the first hydrophilic layer 406, the second hydrophilic layer 436, the third hydrophilic layer 416, the fourth hydrophilic layer 426, the first hydrophilic layer 602, the second hydrophilic layer 604, or a combination thereof.

The apparatus further includes first means for repelling water positioned between the first means for processing electrical signals and the first means for attracting water. For example, the first means for repelling water may include the first hydrophobic layer 104, the second hydrophobic layer 114, the first hydrophobic layer 404, the second hydrophobic layer 414, the third hydrophobic layer 424, the hydrophobic layer 504, the first hydrophobic layer 804, the second hydrophobic layer 814, or a combination thereof.

The apparatus further includes first means for contacting extending through the first means for attracting and the first means for repelling. For example, the first means for contacting may include the first contact 108, the second contact 118, the first contact 408, the second contact 438, the third contact 418, the fourth contact 428, the first contact 510, the second contact 512, or a combination thereof.

In a particular implementation, the apparatus may further include a wafer and a die. The wafer includes first means for processing, first means for attracting, first means for repelling, and first means for conducting. The die includes second means for processing electrical signals, second means for attracting water in contact with the first means for attracting water, second means for repelling water positioned between the second means for processing electrical signals and the second means for attracting water, and second means for contacting extending through the second means for attracting and the second means for repelling. The second means for processing electrical signals may include the second component layer 113, the second semiconductor device 117, the second component layer 413, the third semiconductor device 417, the third component layer 423, the fourth semiconductor device 449, the fifth semiconductor device 451, the first component layer 803, the second component layer 813, or a combination thereof. The second means for attracting water may include the second hydrophilic layer 116, the third hydrophilic layer 416, the fourth hydrophilic layer 426, the first hydrophilic layer 602, the second hydrophilic layer 604, or a combination thereof. The second means for repelling water may include the second hydrophobic layer 114, the second hydrophobic layer 414, the third hydrophobic layer 424, the first hydrophobic layer 804, the second hydrophobic layer 814, or a combination thereof. The second means for contacting may include the second contact 118, the third contact 418, the fourth contact 428, the first contact 510, the second contact 512, or a combination thereof.

In a particular implementation, the wafer further includes third means for attracting water. The first means for repelling water is positioned between the first means for processing electrical signals and the third means for attracting water. For example, the third means for attracting water may include the second hydrophilic layer 436 or the second hydrophilic layer 604.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An apparatus comprising:
   a substrate;
   a first component layer including a first semiconductor device;
   a first hydrophilic layer;
   a first hydrophobic layer positioned between the first component layer and the first hydrophilic layer, the first component layer positioned between the first hydrophobic layer and the substrate; and
   a first contact extending through the first hydrophobic layer and the first hydrophilic layer.

2. The apparatus of claim 1, further comprising:
   a wafer that includes the first component layer, the first hydrophilic layer, the first hydrophobic layer, and the first contact; and
   a die coupled to the wafer, the die comprising a second component layer that includes a second semiconductor device.

3. The apparatus of claim 2, further comprising:
   a second hydrophilic layer in contact with the first hydrophilic layer;
   a second hydrophobic layer positioned between the second component layer and the second hydrophilic layer; and
   a second contact extending through the second hydrophobic layer and the second hydrophilic layer.

4. The apparatus of claim 3, wherein the first semiconductor device is electrically coupled to the first contact and the second semiconductor device is electrically coupled to the second contact.

5. The apparatus of claim 3, wherein the first contact is coupled to the second contact.

6. The apparatus of claim 5, wherein a surface of the first contact is in contact with a surface of the second contact.

7. The apparatus of claim 3, wherein the wafer further includes a third hydrophilic layer, the first hydrophobic layer positioned between the first component layer and the third hydrophilic layer.

8. The apparatus of claim 7, further comprising:
  a second die including:
    a third component layer;
    a fourth hydrophilic layer in contact with the third hydrophilic layer; and
    a third hydrophobic layer positioned between the third component layer and the third hydrophilic layer.

9. The apparatus of claim 8, wherein a footprint of the second die is different from a footprint of the die.

10. The apparatus of claim 9, wherein a surface of the second hydrophilic layer is substantially congruent to a surface of the fourth hydrophilic layer.

11. The apparatus of claim 3, further comprising a dielectric material, wherein a portion of the dielectric material is positioned between the first hydrophobic layer and the second hydrophobic layer, and wherein a sidewall of the portion of the dielectric material is in contact with the first hydrophilic layer and the second hydrophilic layer.

12. The apparatus of claim 1, wherein a surface of the first hydrophilic layer is proximate to a surface of the first hydrophobic layer, and wherein an area of the surface of the first hydrophobic layer is greater than an area of the surface of the first hydrophilic layer.

13. The apparatus of claim 1, wherein the first component layer, the first hydrophobic layer, the first hydrophilic layer, and the first contact are integrated into a mobile device or a base station.

14. The apparatus of claim 1, wherein the first semiconductor device is included in the first component layer.

15. The apparatus of claim 1, further comprising:
  a via extending through the substrate and coupled to circuitry of the first component layer.

16. A method of forming a self-aligning device, the method comprising:
  forming a first component layer on a substrate;
  forming a first hydrophobic layer on the first component layer;
  forming a first hydrophilic layer on the first hydrophobic layer; and
  forming a first contact extending through the first hydrophobic layer and the first hydrophilic layer.

17. The method of claim 16, further comprising:
  forming a second hydrophobic layer on a second component layer;
  forming a second hydrophilic layer on the second hydrophobic layer; and
  forming a second contact extending through the second hydrophobic layer and the second hydrophilic layer.

18. The method of claim 17, wherein the first component layer is included in a wafer, wherein the second component layer is included in a die, and further comprising:
  applying water to the first hydrophilic layer; and
  stacking the die on the wafer so that the second hydrophilic layer contacts the water.

19. The method of claim 16, further comprising depositing a hydrophilic material over the first hydrophobic layer and applying a first photo resist material to a first portion of the hydrophilic material.

20. The method of claim 19, further comprising applying a second photo resist material to a second portion of the hydrophilic material.

21. The method of claim 20, further comprising removing a portion of the hydrophilic material to form the first hydrophilic layer corresponding to the first portion and to form a second hydrophilic layer corresponding to the second portion.

22. The method of claim 21, wherein the first hydrophilic layer and the second hydrophilic layer have substantially the same dimensions.

23. The method of claim 16, wherein the first component layer, the first hydrophobic layer, and the first hydrophilic layer are included in a wafer, the method further comprising dividing the wafer into a plurality of dies, each die including a hydrophobic layer between a hydrophilic layer and a component layer.

24. The method of claim 23, wherein the plurality of dies includes at least two dies having varying sizes.

25. An apparatus comprising:
  first means for processing electrical signals;
  first means for attracting water;
  first means for repelling water positioned between the first means for processing electrical signals and the first means for attracting water, the first means for processing electrical signals positioned between the first means for repelling water and a substrate; and
  first means for contacting extending through the first means for attracting and the first means for repelling.

26. The apparatus of claim 25, further comprising:
  a wafer, wherein the wafer includes the first means for processing, the first means for attracting, the first means for repelling, and the first means for conducting; and
  a die including:
    second means for processing electrical signals;
    second means for attracting water in contact with the first means for attracting water;
    second means for repelling water positioned between the second means for processing electrical signals and the second means for attracting water; and
    second means for contacting extending through the second means for attracting and the second means for repelling.

27. The apparatus of claim 26, further comprising:
  a wafer including the first means for processing, the first means for attracting, the first means for repelling, and the first means for conducting; and
  a die including the second means for processing, the second means for attracting, the second means for repelling, and the second means for conducting, wherein the first means for conducting is bonded to the second means for conducting.

28. The apparatus of claim 26, wherein the wafer further includes third means for attracting water, the first means for repelling water positioned between the first means for processing electrical signals and the third means for attracting water.

29. A self-aligned device stack comprising:
  a first semiconductor device;
  a first hydrophobic layer having a first surface area;
  a first hydrophilic layer in contact with the first hydrophobic layer;

a second hydrophilic layer in contact with the first hydrophilic layer;
a second hydrophobic layer in contact with the second hydrophilic layer and having a second surface area that is different from the first surface area; and
a second semiconductor device.

30. The self-aligned device stack of claim 29, wherein the first hydrophobic layer, the first hydrophilic layer, the second hydrophilic layer, and the second hydrophobic layer are positioned between the first semiconductor device and the second semiconductor device.

* * * * *